United States Patent [19]
Hoffman

[11] Patent Number: 5,457,435
[45] Date of Patent: Oct. 10, 1995

[54] PULSE WIDTH MODULATED DRIVER

[75] Inventor: John P. Hoffman, Peoria, Ill.

[73] Assignee: Caterpillar Inc., Peoria, Ill.

[21] Appl. No.: 217,838

[22] Filed: Mar. 25, 1994

[51] Int. Cl.⁶ .................................................. H03K 7/08
[52] U.S. Cl. ........................................ 332/110; 332/109
[58] Field of Search ................................ 332/109, 110, 332/111; 375/22

[56] References Cited

U.S. PATENT DOCUMENTS

| | | | |
|---|---|---|---|
| 2,951,212 | 8/1960 | Schmid | 332/110 |
| 3,090,929 | 5/1963 | Thompson | 332/110 |
| 3,441,877 | 4/1969 | Thompson | 332/9 |
| 4,015,213 | 3/1977 | Hamada | 330/10 |
| 4,063,199 | 12/1977 | Oursler, Jr. | 332/41 |
| 4,315,212 | 2/1982 | Gamoh | 324/142 |
| 4,509,547 | 4/1985 | Smith et al. | 137/85 |
| 4,524,335 | 6/1985 | Yokoyama | 332/110 |
| 4,591,810 | 5/1986 | Mackenzie et al. | 332/9 R |
| 4,641,683 | 2/1987 | Murner | 137/487.5 |
| 4,960,365 | 10/1990 | Horiuchi | 417/222 |
| 5,113,158 | 5/1992 | Tsuji et al. | 332/109 |

FOREIGN PATENT DOCUMENTS

| | | | |
|---|---|---|---|
| 0104127 | 8/1980 | Japan | 332/110 |
| 0111121 | 7/1982 | Japan | 332/109 |
| 0210723 | 12/1982 | Japan | 332/109 |
| 0130617 | 8/1983 | Japan | 332/109 |
| 0067719 | 4/1984 | Japan | 332/109 |

Primary Examiner—David Mis
Attorney, Agent, or Firm—James R. Yee

[57] ABSTRACT

The present invention an apparatus provides a pulse width modulated signal to a load in response to an input signal. The apparatus receives the input signal and a feedback signal, determines a difference between the received signals, integrates the difference, and responsively produces an error signal. The error signal is compared with a reference wave signal and a correction signal is produced. The apparatus produces the pulse width modulation signal by conditioning the correction signal. The apparatus determines the feedback signal by attenuating the pulse width modulation signal in a manner similar to the attenuation caused by the load.

8 Claims, 2 Drawing Sheets

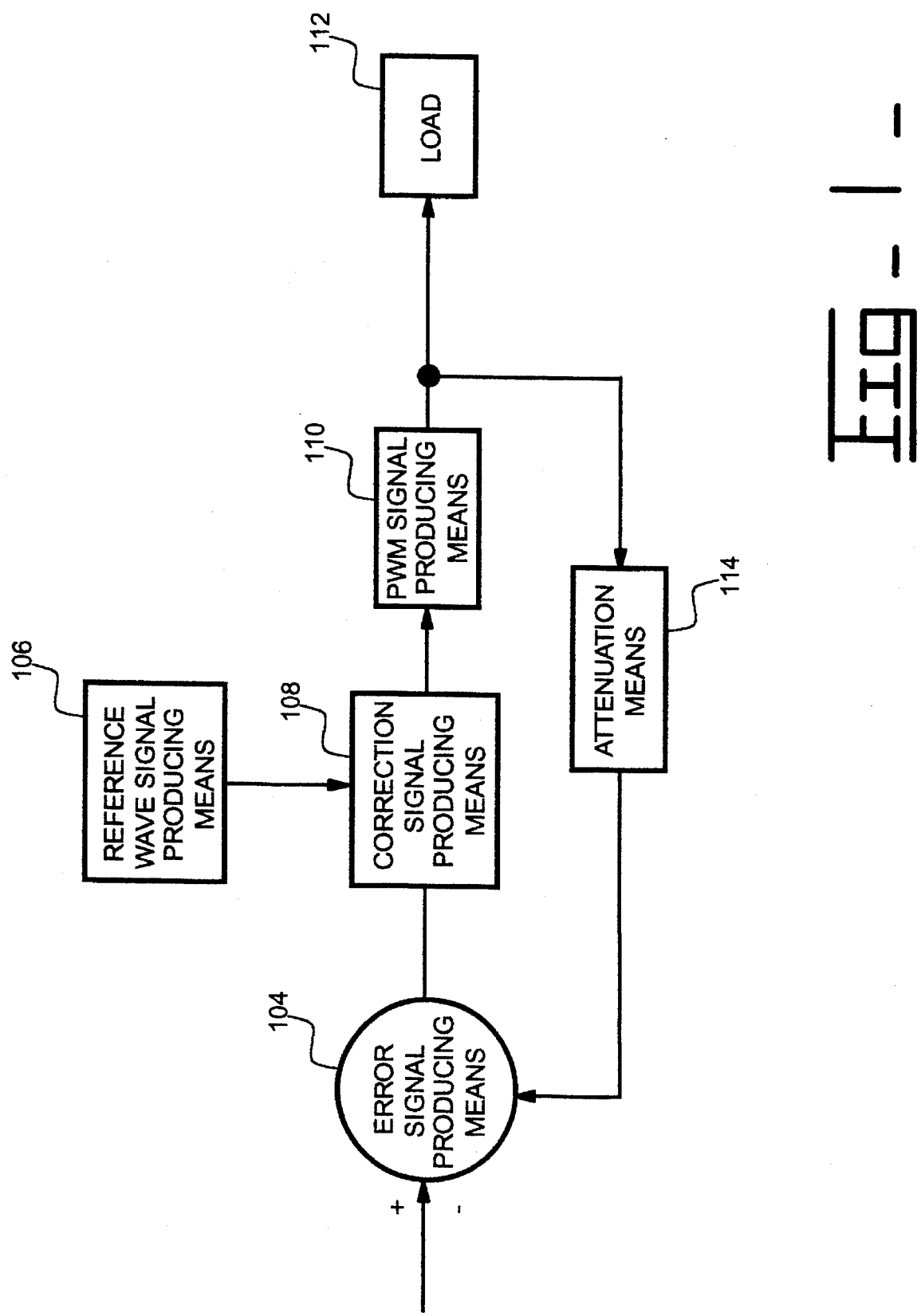

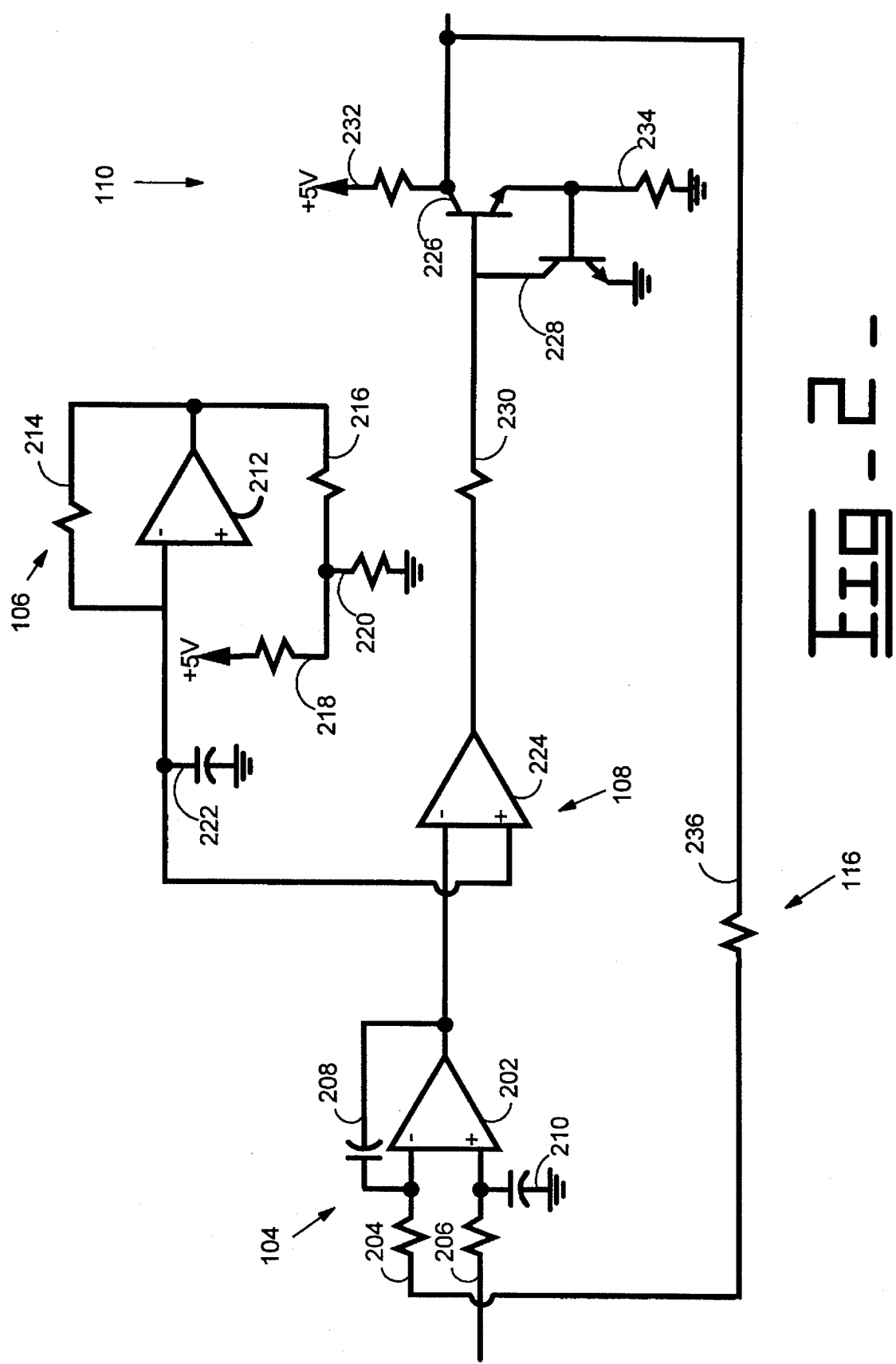

5,457,435

PULSE WIDTH MODULATED DRIVER

TECHNICAL FIELD

This invention relates generally to a pulse width modulated driver circuit, and more particularly, to a pulse width modulated driver circuit with feedback.

BACKGROUND ART

Pulse width modulated (PWM) circuits are used for a variety of purposes. For instance, in automotive or vehicle electronics, PWM drivers are used to communicate both data and commands to and from electronic control modules (ECM).

One type of PWM is known as duty cycle modulation (DCM). In duty cycle modulation, a pulse waveform is transmitted from a source to a destination. The pulse waveform consists of a series of signals having a set period. Each signal includes a pulse. The pulse is defined where the signal is "on", i.e., has a particular value. The duty cycle of each signal is the relationship between the pulse width and the period. The pulse waveform carries data or commands by varying the width, and therefore the duty cycle of each signal.

PWM drivers are used, for example, to carry data from sensors to an ECM. PWM drivers are generally more accurate than analog circuits because the signals are digital in nature and not as susceptible to noise and other forms of interference. This becomes more apparent when the signals are transmitted over longer distances.

However, in order to be useful, a PWM driver must be very accurate. Thus, typical PWM circuits contain additional components to ensure accuracy. For example, a PWM circuit may contain as many or more as 6 operational amplifiers and/or comparators. As PWM drivers are very useful in automotive or vehicle electronics, there may be quite a few such PWM drivers per vehicle. In order to reduce costs, it is therefore desirable to reduce the number of components.

The present invention is directed to overcoming one or more of the problems, as set forth above.

DISCLOSURE OF THE INVENTION

In one aspect of the present invention, an apparatus for providing a pulse width modulated signal to a load in response to an input signal is provided. The apparatus receives the input signal and a feedback signal, sums the received signals, and responsively produces an error signal. The error signal is compared with a reference wave signal and a correction signal is produced. The apparatus produces the pulse width modulation signal by conditioning the correction signal. The apparatus determines the feedback signal by attenuating the pulse width modulation signal in a manner similar to the attenuation caused by the load.

BRIEF DESCRIPTION OF THE DRAWINGS

FIG. 1 is a block diagram of a pulse width modulation (PWM) driver circuit, according to an embodiment of the present invention; and FIG. 2 is a schematic of the PWM driver of circuit according to an embodiment of the present invention.

BEST MODE FOR CARRYING OUT THE INVENTION

With reference to FIGS. 1 and 2, the present invention, provides an apparatus 102 for providing a pulse width modulated signal to a load 112 in response to an input signal. The input signal is an analog signal. Generally, the magnitude of the analog signal is related to the data to be transmitted.

A means 104 receives the input signal and a feedback signal, determines the difference between the input signal and the feedback signal, integrates the difference and responsively produces an error signal.

In the preferred embodiment, the error signal producing means 104 includes a first operational amplifier 202. One end of a first resistor 204 is connected to the negative input terminal of the first operation amplifier 202. A second resistor 206 is connected to the positive input terminal of the first operational amplifier 202. The input signal is received by the first operational amplifier 202 via the second resistor 206. A first capacitor 208 is connected between the output terminal and the negative input terminal of the first operational amplifier 202. A second capacitor 210 is connected between the positive input terminal of the first operational amplifier and electrical ground.

A means 106 produces a reference wave signal. Preferably, the reference wave signal has a pseudo-triangular or exponential wave form.

In the preferred embodiment, the reference wave signal producing means 106 includes a first comparator 212. A third resistor 214 is connected between the output terminal and the negative input terminal of the first comparator 212. One end of a fourth resistor 216 is also connected to the output terminal of the first comparator 212. A fifth resistor 218 is connected between the other end of the fourth resistor 216 and a first voltage reference ($V_{R1}$). In the preferred embodiment the first voltage reference is equal to +5 volts. A sixth resistor 220 is connected between the juncture of the fourth and fifth resistors and electrical ground and to a positive input terminal of the first comparator 212. A second capacitor 222 is connected between the negative input terminal of the first comparator 212 and electrical ground.

A means 108 receives the error signal and the reference wave signal, compares the error signal and the reference wave signal, and responsively produces a correction signal. In the preferred embodiment, the correction signal producing means 108 includes a second comparator 224. The positive input terminal of the second comparator 224 is connected to the negative input terminal of the first comparator 212. The negative input terminal of the second comparator 224 is connected to the output terminal of the first operation amplifier 202.

A means 110 receives the correction signal, conditions the correction signal, and responsively produces the pulse width modulated signal.

In the preferred embodiment, the pulse width modulated signal producing means 110 includes a first NPN transistor 226. The base terminal of a second NPN transistor 228 is connected to the emitter terminal of the first NPN transistor 226. The collector of the second NPN transistor 228 is connected to the base of the first NPN transistor 226. The emitter of the second NPN transistor 228 is connected to electrical ground. A seventh resistor 230 is connected between the output of the second comparator 224 and the base of the first NPN transistor 226. An eighth resistor 232 is connected between the collector of the first NPN transistor 226 and a second voltage reference ($V_{R2}$). The second voltage reference defines the input voltage range (0 to ($V_{R2}$)). In the preferred embodiment, the second voltage reference is equal to +5 volts. A ninth resistor 234 is connected between the base of the second NPN transistor 228 and electrical ground.

A means 114 receives the pulse width modulated signal, attenuates the pulse width modulated signal and responsively produces the feedback signal. The attenuation of the pulse width modulated signal models the attenuation of the pulse width signal by the load 112. The attenuating means 114 models the impedance of the load 112. Thus, if the impedance ($Z_{load}$) has a value of z, then the attenuation means 114 is designed to have an impedance ($Z_{model}$) substantially equal to z. For example, if, as shown in FIG. 2, $Z_{load}$ is substantially equal to resistance r, then the attenuation means 114 includes tenth resistor 236 having resistance r.

It should be noted that a load having an impedance of r is the simplest case. A particular load may have a more complex impedance. Loads having more complex impedances may be modelled by, for example, a network composed of resistors, capacitors, and/or inductors.

INDUSTRIAL APPLICABILITY

With reference to the drawings and in operation, the present invention provides a pulse width modulation driver 102. The driver 102 receives an input signal. Generally, the input signal has a magnitude related to the information to be transmitted by the driver 102.

The driver 102 produces a pulse width modulated signal as a function of the input signal. In the preferred embodiment, the driver produces a duty cycle modulated (DCM) signal. The DCM signal is composed of a series of signals of a predetermined and set period. The transmitted data is contained in the duty cycle of each signal, i.e., the relationship between the "on" time of the signal and the period.

The driver 102 of the present invention is able to provide a more accurate signal while reducing the number of components by modeling the attenuation of the output signal by the load.

Other aspects, objects, and features of the present invention can be obtained from a study of the drawings, the disclosure, and the appended claims.

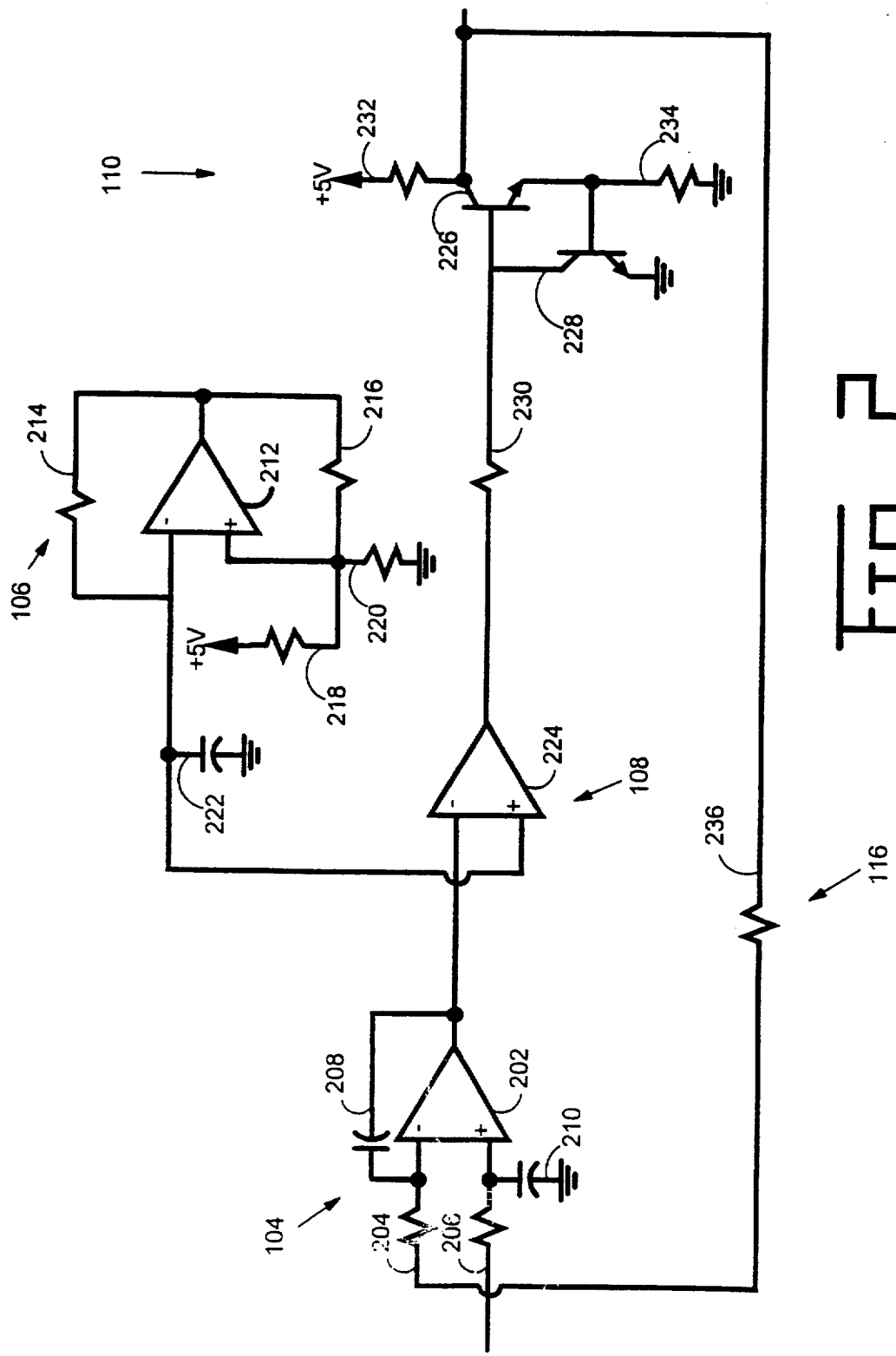

I claim:

1. An apparatus for providing a pulse width modulated signal to a load in response to an input signal, comprising:

means for receiving the input signal and a feedback signal, determines a difference between said input signal and said feedback signal, integrates said difference, and responsively producing an error signal;

means for producing a reference wave signal;

means for receiving said error signal and said reference wave signal, comparing said error signal and said reference wave signal, and responsively producing a correction signal;

means for receiving said correction signal, conditioning said correction signal, and responsively producing the pulse width modulated signal; and means for receiving said pulse width modulated signal, attenuating said pulse width modulated signal and responsively producing said feedback signal, wherein the attenuation of said pulse width modulated signal models the attenuation of said pulse width signal by the load.

2. An apparatus, as set forth in claim 1, wherein error producing signal producing means includes a first operation amplifier.

3. An apparatus, as set forth in claim 2, wherein said error signal producing means includes:

a first resistor connected between said pulse width modulated signal attenuation means and a negative input terminal of said first operation amplifier;

a second resistor connected to a positive input terminal of said first operational amplifier;

a first capacitor connected between an output terminal and said negative input terminal of said first operational amplifier; and a second capacitor connected between said positive input terminal of said first operational amplifier and electrical ground.

4. An apparatus, as set forth in claim 1, wherein said reference wave signal is triangular in form.

5. An apparatus, as set forth in claim 4, wherein said reference wave signal producing means includes:

a first comparator;

a third resistor connected between an output terminal and a negative input terminal of said first comparator;

a fourth resistor having one end connected to said output terminal of said first comparator;

a fifth resistor connected between another end of said fourth resistor and a voltage reference;

a sixth resistor connected between the juncture between said fourth and fifth resistors and electrical ground and to a positive input terminal of said first comparator; and, a second capacitor connected between said negative input terminal of said first comparator and electrical ground.

6. An apparatus, as set forth in claim 1, wherein said correction signal producing means includes a second comparator.

7. An apparatus, as set forth in claim 1, wherein said pulse width modulated signal producing means includes:

a first NPN transistor;

a second NPN transistor having a base connected to an emitter of said first NPN transistor, a collector connected to a base of said first NPN transistor, and an emitter connected to electrical ground;

a seventh resistor connected between said comparing means and said base of said first NPN transistor;

an eighth resistor connected between a collector of said first NPN transistor and a voltage reference; and a ninth resistor connected between said base of said second NPN transistor and electrical ground.

8. An apparatus for providing a pulse width modulated signal to a load in response to an input signal, comprising:

a first operation amplifier;

a first resistor connected at one end to a negative input terminal of said first operation amplifier;

a second resistor connected to a positive input terminal of said first operational amplifier, said second resistor being adapted to receive the input signal;

a first capacitor connected between an output terminal and said negative input terminal of said first operational amplifier;

a second capacitor connected between said positive input of said first operational amplifier and electrical ground;

means for producing a reference wave signal;

a comparator having a positive input terminal connected said reference wave signal producing means and to a negative input terminal connected to said output terminal of said first operational amplifier;

a first NPN transistor;

a second NPN transistor having a base connected to an emitter of said first NPN transistor, a collector connected to a base of said first NPN transistor, and an emitter connected to electrical ground;

a seventh resistor connected between an output terminal of said comparator and said base of said first NPN transistor;

an eighth resistor connected between a collector of said first NPN transistor and a voltage reference;

a ninth resistor connected between said base of said second NPN transistor and electrical ground, wherein said first NPN transistor being adapted to produce the pulse width modulated signal at its collector; and, means, connected between said collector of said first NPN transistor and another end of said first resistor, for receiving said pulse width modulated signal, attenuating said pulse width modulated signal and responsively producing said feedback signal, wherein the attenuation of said pulse width modulated signal models the attenuation of said pulse width signal by the load.

* * * * *

UNITED STATES PATENT AND TRADEMARK OFFICE
CERTIFICATE OF CORRECTION

PATENT NO. : 5,457,435

DATED : October 10, 1995

INVENTOR(S) : John P. Hoffman

It is certified that error appears in the above-identified patent and that said Letters Patent is hereby corrected as shown below:

Column 2, lines 38-40,

"A sixth resistor 220 is connected between the juncture of the fourth and fifth resistors and electrical ground and to a positive input terminal of the first comparator 212."

In Fig. 2, the connection from the juncture to the positive input terminal of comparator 212 was omitted. A corrected Fig. 2 is attached.

Signed and Sealed this

Fifth Day of March, 1996

*Attest:*

BRUCE LEHMAN

*Attesting Officer*     Commissioner of Patents and Trademarks